(12) United States Patent
Yu et al.

(10) Patent No.: US 12,512,448 B2
(45) Date of Patent: Dec. 30, 2025

(54) MULTI-LAYER STACKED CHIP PACKAGE (71) Applicant: WALTON ADVANCED ENGINEERING, INC., Kaohsiung (TW)

(72) Inventors: Hong-Chi Yu, Kaohsiung (TW); Chun-Jung Lin, Kaohsiung (TW); Ruei-Ting Gu, Kaohsiung (TW)

(73) Assignee: WALTON ADVANCED ENGINEERING, INC., Kaohsiung (TW)

( * ) Notice: Subject to any disclaimer, the term of this patent is extended or adjusted under 35 U.S.C. 154(b) by 461 days.

(21) Appl. No.: 18/210,091

(22) Filed: Jun. 15, 2023

(65) Prior Publication Data

US 2023/0411363 A1    Dec. 21, 2023

(30) Foreign Application Priority Data

Jun. 17, 2022    (TW) .................................. 111122655

(51) Int. Cl.
    *H01L 25/10*    (2006.01)
    *H01L 23/31*    (2006.01)
    *H01L 23/538*    (2006.01)

(52) U.S. Cl.
    CPC ........ *H01L 25/105* (2013.01); *H01L 23/3107* (2013.01); *H01L 23/5389* (2013.01); *H01L 2225/1023* (2013.01); *H01L 2225/1035* (2013.01); *H01L 2225/107* (2013.01)

(58) Field of Classification Search
    CPC ............... H01L 25/105; H01L 23/3107; H01L 23/5389; H01L 2225/1023
    See application file for complete search history.

(56) References Cited

U.S. PATENT DOCUMENTS

2001/0010627 A1*    8/2001    Akagawa ............ H01L 23/3121
    361/764

* cited by examiner

*Primary Examiner* — Trang Q Tran
(74) *Attorney, Agent, or Firm* — Fei-Hung Yang (57) ABSTRACT

A multi-layer stacked chip package is provided. A first substrate, a first circuit layer, a first chip, and a first insulation layer form a lower layer chip package while a second substrate, a second circuit layer, a second chip, and a second insulation layer form an upper layer chip package. The upper layer chip package is stacked over the lower layer chip package so that the multi-layer stacked chip package is formed by such stacking mode. One of the at least two chips is used to operate the rest chips or computing functions of the respective chips are combined to increase overall computing performance.

5 Claims, 8 Drawing Sheets

MULTI-LAYER STACKED CHIP PACKAGE

CROSS-REFERENCE TO RELATED APPLICATIONS

This non-provisional application claims priority under 35 U.S.C. § 119(a) on Patent Application No(s). 111122655 filed in Taiwan, R.O.C. on Jun. 17, 2022, the entire contents of which are hereby incorporated by reference.

BACKGROUND OF THE INVENTION

The present invention relates to a chip package, especially to a multi-layer stacked chip package.

Along with fast development of technology industry and techniques, the design of chip package products not only requires area reduction but also higher computational performance of chips. Manufacturers keep developing the chips with higher computational speed. However, the increased computational speed of the chip leads to higher cost in development and production of the chip. Thus there is a room for improvement and there is an urgent need to provide a multi-layer stacked chip package which reduces area of the chip package product and decreases production cost.

SUMMARY OF THE INVENTION

Therefore, it is a primary object of the present invention to provide a multi-layer stacked chip package which includes at least two substrates, at least two circuit layers, at least two chips, at least two insulation layers, and a lower circuit layer. A first substrate, a first circuit layer, a first chip, and a first insulation layer form a lower layer chip package while a second substrate, a second circuit layer, a second chip, and a second insulation layer form an upper layer chip package. The upper layer chip package is stacked over the lower layer chip package so that the multi-layer stacked chip package is formed by such stacking mode. Thereby one of the chips is used to operate the rest chips or computing functions of the respective chips are combined to increase overall computing performance. The problem of increasing cost caused by development of the chips with higher computing performance to minimize chip area of chip scale package products can be solved.

In order to achieve the above object, a multi-layer stacked chip package according to the present invention includes at least two substrates, at least two circuit layers, at least two chips, at least two insulation layers, and a lower circuit layer. The substrates consist of a first substrate and a second substrate located over the first substrate. Thus the first substrate and the second substrate are respectively disposed on a lower position and an upper position and corresponding to each other. The first substrate is provided with a first surface and a second surface opposite to each other while at least one first blind hole is mounted on the first surface of the first substrate. The second substrate is also provided with a first surface and a second surface opposite to each other while at least one second blind hole is arranged at the first surface of the second substrate. At least one first insertion hole is disposed between the second blind hole of the second substrate and the first substrate. Or the first insertion hole is formed between the second blind hole of the second substrate and the first blind hole of the first substrate. The two circuit layers include a first circuit layer and a second circuit layer located over the first circuit layer. The first and the second circuit layers are disposed on a lower positon and an upper position and correspondingly to each other. The first circuit layer is disposed on the first surface of the first substrate and extended along an inner wall surface of the respective first blind holes. The second circuit layer is arranged at the first surface of the second substrate and extended along an inner wall surface of the respective second blind holes. The chips include a first chip and a second chip located over the first chip. The first chip and the second chip are respectively arranged at a lower position and an upper position and corresponding to each other. The first chip and the second chip are respectively electrically connected with and disposed on the first circuit layer and the second circuit layer. The insulation layers consist of a first insulation layer and a second insulation layer located over the first insulation layer. The first insulation layer and the second insulation layer are respectively disposed on a lower positon and an upper position and corresponding to each other. The first insulation layer and the second insulation layer are respectively covering the first surface of the first substrate and the first surface of the second substrate by injection while the lower circuit layer is disposed on the second surface of the first substrate for external electrical connection. The first substrate, the first circuit layer, the first chip, and the first insulation layer form a lower layer chip package while the second substrate, the second circuit layer, the second chip, and the second insulation layer form an upper layer chip package. The upper layer chip package is stacked over the lower layer chip package so that the multi-layer stacked chip package is formed by such stacking mode. The first chip is electrically connected with the lower circuit layer by the first circuit layer. The second chip is electrically connected with the first chip by the second circuit layer extending to the first chip through the respective first insertion holes, or electrically connected with the lower circuit layer by the second circuit layer extending to the lower circuit layer through the respective first insertion holes optionally. The above design is beneficial to production area minimization and cost reduction at manufacturing end.

Preferably, a vertical axis of the second blind hole and a vertical axis of the first insertion hole are the same as a vertical axis of the first blind hole so that the second blind hole, the first insertion hole, and the first blind hole form a communicating hole.

Preferably, a vertical axis of the second blind hole and a vertical axis of the first insertion hole are not the same as a vertical axis of the first blind hole. Thus the second blind hole, the first insertion hole, and the first blind hole are not communicating with one another.

Preferably, a lower outer protective layer is arranged under the lower circuit layer and provided with at least one lower opening on which a solder ball is disposed for external electrical connection.

Preferably, the multi-layer stacked chip package is further provided with an upper substrate, an upper circuit layer, an external chip, and an upper insulation layer. The upper substrate is disposed on the second insulation layer and provided with a first surface while at least one upper blind hole formed on the first surface of the upper substrate. At least one upper insertion hole is mounted between the upper blind hole of the upper substrate and the second substrate. Or the respective upper insertion holes are arranged between the respective upper blind holes of the upper substrate and the respective second blind holes of the second substrate. The upper circuit layer is disposed on the first surface of the upper substrate and extending to an inner wall surface of the respective upper blind boles. The external chip is arranged at and electrically connected with the upper circuit layer. The upper insulation layer is covering the first surface of the upper substrate by injection technique. Optionally, the external chip can be electrically connected with the second chip by the upper circuit layer extending to the second chip through the respective upper insertion holes, electrically connected with the first chip by the upper circuit layer extending to the first chip through the respective upper insertion holes and the respective first insertion holes, or electrically connected with the lower circuit layer by the upper circuit layer extending to the lower circuit layer through the respective upper insertion holes and the respective first insertion holes.

DETAILED DESCRIPTION OF THE PREFERRED EMBODIMENT

Figure 1:
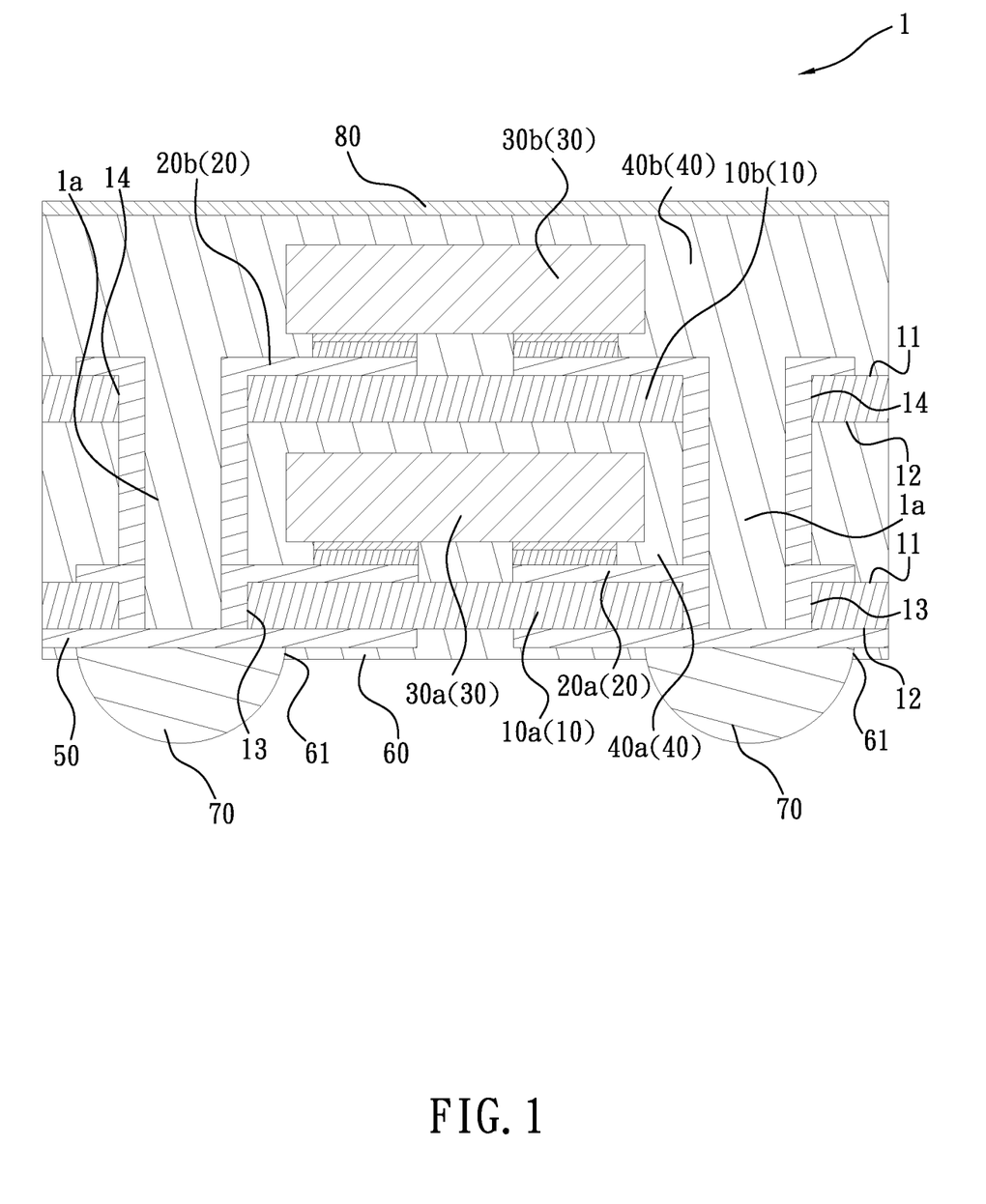
FIG. 1 is a side view of a section of an embodiment of a multi-layer stacked chip package with two chips according to the present invention.
Figure 2:
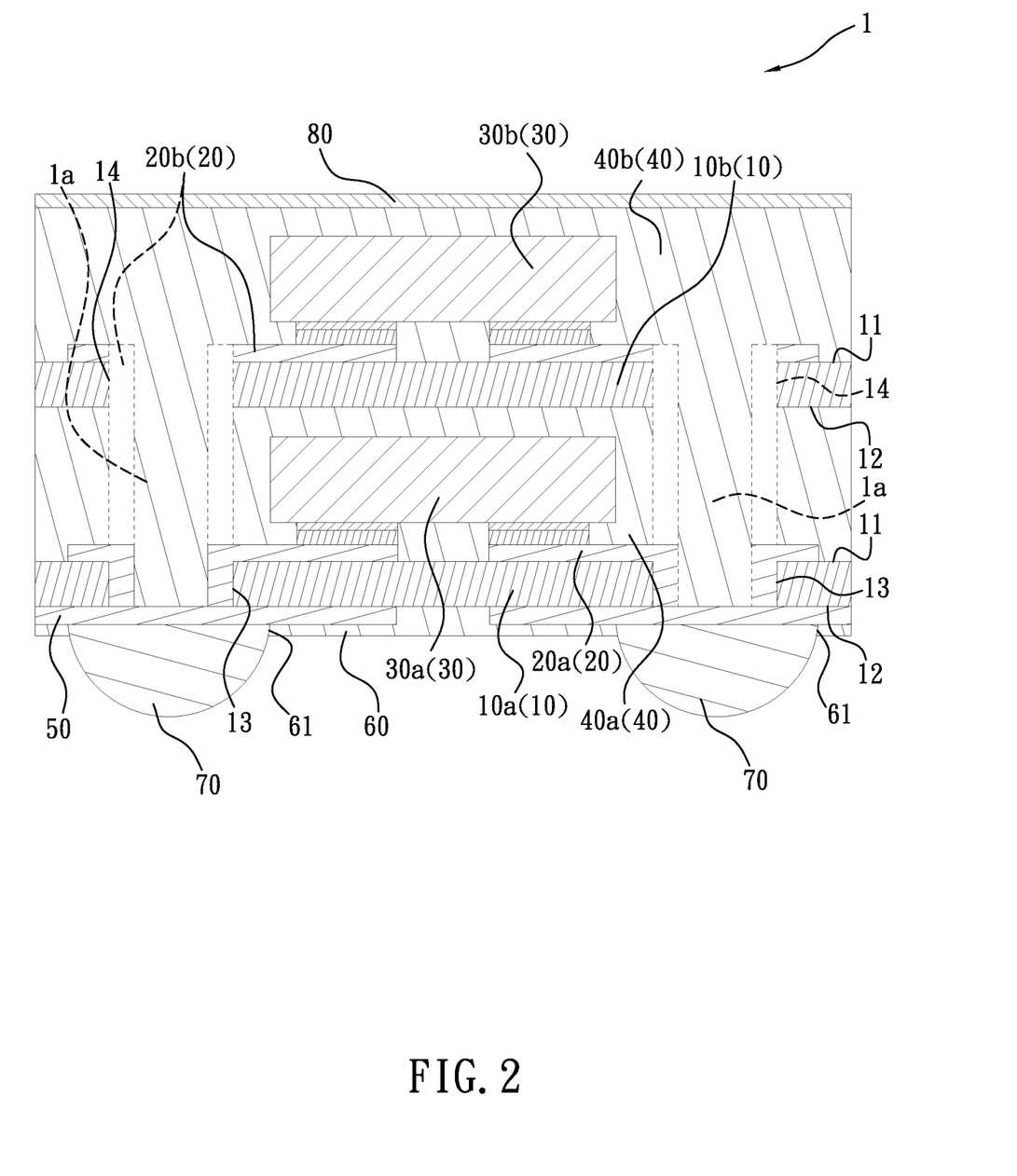
FIG. 2 is a side view of a section of an embodiment in which first blind holes and second blind holes are not communicating according to the present invention.

Refer to FIG. 1 and FIG. 2, a multi-layer stacked chip package 1 according to the present invention includes at least two substrates 10, at least two circuit layers 20, at least two chips 30, at least two insulation layers 40, and a lower circuit layer 50. A top of the multi-layer stacked chip package 1 is further provided with, but not limited to, an upper outer protective layer 80 in order to protect the multi-layer stacked chip package 1 and increase a yield rate, as shown in FIG. 1 and FIG. 2.

The substrates 10 consist of a first substrate 10a and a second substrate 10b located over the first substrate 10a, as shown in FIG. 1 and FIG. 2. The first and the second substrates 10a, 10b are respectively disposed on a lower position and an upper position and corresponding to each other. The first substrate 10a is provided with a first surface 11 and a second surface 12 opposite to each other. At least one first blind hole 13 is mounted on the first surface 11 of the first substrate 10a. Refer to FIG. 1 and FIG. 2, the multi-layer stacked chip package 1 includes the two first blind holes 13, but not limited, and a depth of the respective blind holes 13 is equal to a thickness of the first substrate 10a, but not limited. The second substrate 10b is provided with a first surface 11 and a second surface 12 opposite to each other. At least one second blind hole 14 is formed on the first surface 11 of the second substrate 10b. Refer to FIG. 1 and FIG. 2, the multi-layer stacked chip package 1 includes the two second blind holes 14, but not limited. At least one first insertion hole 1a is arranged between the second blind hole 14 of the second substrate 10b and the first substrate 10a. Or the first insertion hole 1a is formed between the second blind hole 14 of the second substrate 10b and the first blind hole 13 of the first substrate 10a. As shown in FIG. 1 and FIG. 2, the multi-layer stacked chip package 1 includes the two first insertion holes 1a, but not limited, and a depth of the second blind hole 14 is equal to a thickness of the second substrate 10b, but not limited.

The two circuit layers 20 are a first circuit layer 20a and a second circuit layer 20b located over the first circuit layer 20a, as shown in FIG. 1 and FIG. 2. The first and the second circuit layers 20a, 20b are respectively disposed on a lower positon and an upper position and corresponding to each other. The first circuit layer 20a is disposed on the first surface 11 of the first substrate 10a and extended along an inner wall surface of the respective first blind holes 13, as shown in FIG. 1 and FIG. 2. The second circuit layer 20b is arranged at the first surface 11 of the second substrate and extended along an inner wall surface of the respective second blind holes 14, as shown in FIG. 1 and FIG. 2.

The two chips 30 include a first chip 30a and a second chip 30b located over the first chip 30a, as shown in FIG. 1 and FIG. 2. The first chip 30a and the second chip 30b are arranged vertically with respect to each other. The first chip 30a and the second chip 30b are respectively electrically connected with and disposed on the first circuit layer 20a and the second circuit layer 20b.

The two insulation layers 40 consist of a first insulation layer 40a and a second insulation layer 40b located over the first insulation layer 40a. The first insulation layer 40a and the second insulation layer 40b are respectively disposed on a lower position and an upper position and corresponding to each other. The first insulation layer 40a is covering the first surface 11 of the first substrate 10a by injection for coating and filling gaps left in the multi-layer stacked chip package 1 by the first chip 30a. The second insulation layer 40b is covering the first surface 11 of the second substrate 10b by injection for coating and filling gaps left in the multi-layer stacked chip package 1 by the second chip 30b.

As shown in FIG. 1 and FIG. 2, the lower circuit layer 50 is disposed on the second surface 12 of the first substrate 10a for external electrical connection. Thus the multi-layer stacked chip package 1 is electrically connected with other electronic components (not shown in figure) by the lower circuit layer 50. The first circuit layer 20a is extending downward along the inner wall surface of the respective first blind holes 13 to be electrically connected with the lower circuit layer 50, as shown in FIG. 1 and FIG. 2. The second circuit layer 20b is extending downward to an inner wall surface of the respective first insertion holes 1a along the inner wall surface of the respective second blind holes 14 to be electrically connected with the first circuit layer 20a, as shown in FIG. 1 and FIG. 2. Or the second circuit layer 20b is extending downward to an inner wall surface of the respective first blind holes 13 along the inner wall surface of the respective second blind holes 14 and the inner wall surface of the respective first insertion holes 1a to be electrically connected with the lower circuit layer as shown in FIG. 1 and FIG. 2.

Figure 3:
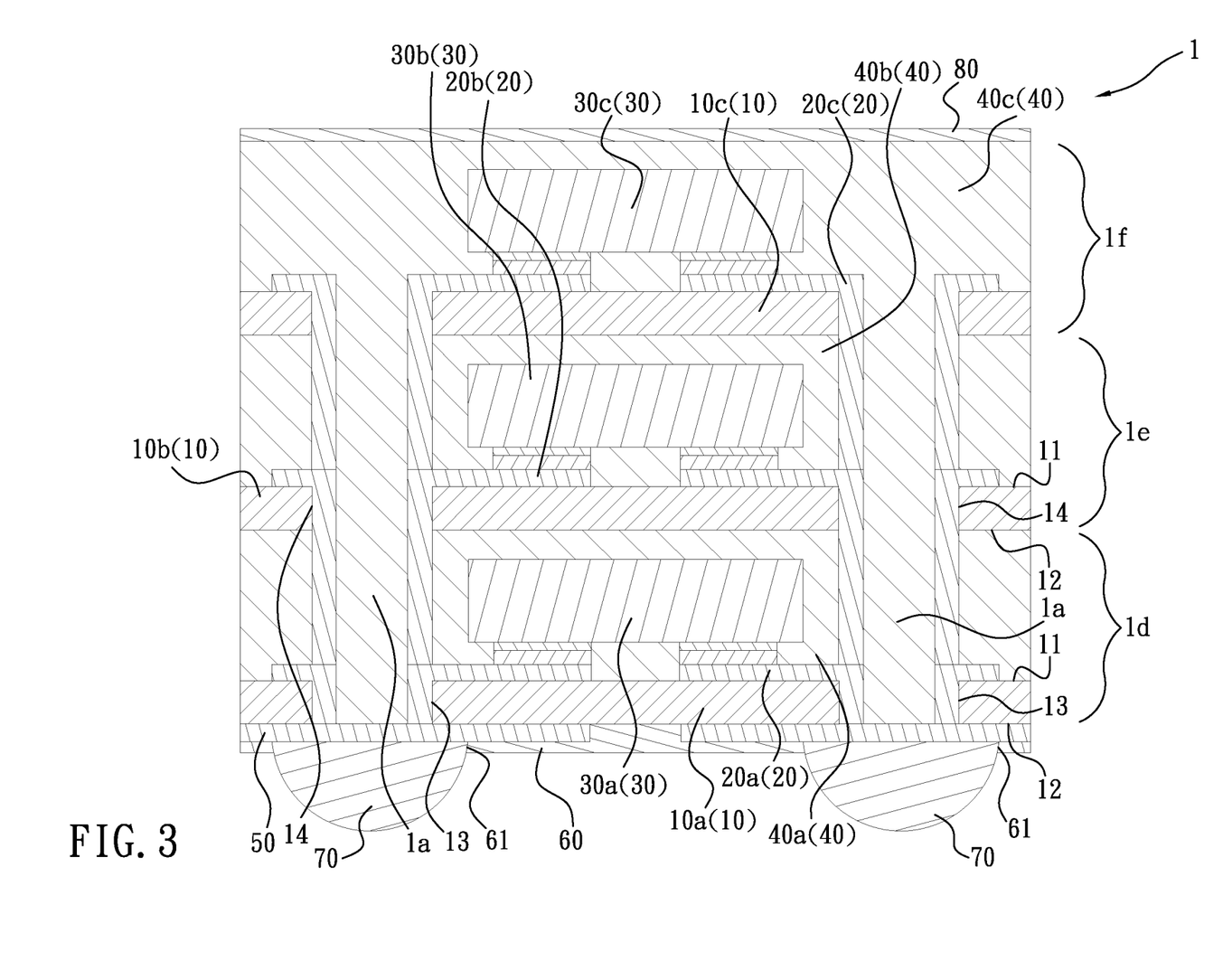
FIG. 3 is a side view of a section of an embodiment of a multi-layer stacked chip package with three chips according to the present invention.

As show in FIG. 3, a first layer chip package 1d composed of the first substrate 10a, the first circuit layer 20a, the first chip 30a, and the first insulation layer 40a is a lower layer chip package, but not limited while a second layer chip package 1e composed of the second substrate 10b, the second circuit layer 20b, the second chip 30b, and the second insulation layer 40b is an upper layer chip package, but not limited. The upper layer chip package is stacked over the lower layer chip package and the multi-layer stacked chip package 1 is formed by such stacking mode.

Refer to FIG. 1 and FIG. 2, the first chip 30a is electrically connected with the lower circuit layer 50 by the first circuit layer 20a. The second chip 30b can be electrically connected with the first chip 30a by the second circuit layer 20b extending to the first chip 30a through the respective first insertion holes 1a or electrically connected with the lower circuit layer 50 by the second circuit layer 20b extending to the lower circuit layer 50 through the respective first insertion holes 1a optionally.

Refer to FIG. 1 and FIG. 2, by the electrical connection between the first chip 30a and the second chip 30b (the respective chips 30) in the multi-layer stacked chip package 1, one of the chips 30 (such as the second chip can perform operations on other chips 30 (such as the first chip 30a) or computation functions of the chips 30 are superposed to increase overall computation efficiency.

Refer to FIG. 1, a vertical axis of the second blind hole 14 and a vertical axis of the first insertion hole 1a are the same as a vertical axis of the first blind hole 13, but not limited. Thus the second blind hole 14, the first insertion hole 1a, and the first blind hole 13 form a communicating hole. Thereby during formation of the second blind hole 14, the first insertion hole 1a is also formed. The production steps are simplified and production cost at manufacturing end is further reduced.

Refer to FIG. 2, a vertical axis of the second blind hole 14 and a vertical axis of the first insertion hole 1a are not the same as a vertical axis of the first blind hole 13. Thus the second blind hole 14, the first insertion hole 1a, and the first blind hole 13 are not communicating with one another. The manufacturers can provide diversified arrangement and design of the second blind hole 14, the first insertion hole 1a, and the first blind hole 13.

Refer to FIG. 1 and FIG. 2, a lower outer protective layer 60 is arranged under the lower circuit layer 50 and provided with at least one lower opening 61 on which a solder ball 70 is disposed for external electrical connection. Thus the multi-layer stacked chip package 1 can be electrically connected with other electronic components by the solder ball 70. For example, the multi-layer stacked chip package 1 can be interconnected with other electronic components by flip chip technique (not shown in figure).

to FIG. 1 and FIG. 5-11, when the multi-layer stacked chip package 1 is formed by two layers of chip package stacked over each other, a method of manufacturing the multi-layer stacked chip package 1 includes the following steps.

Figure 5:
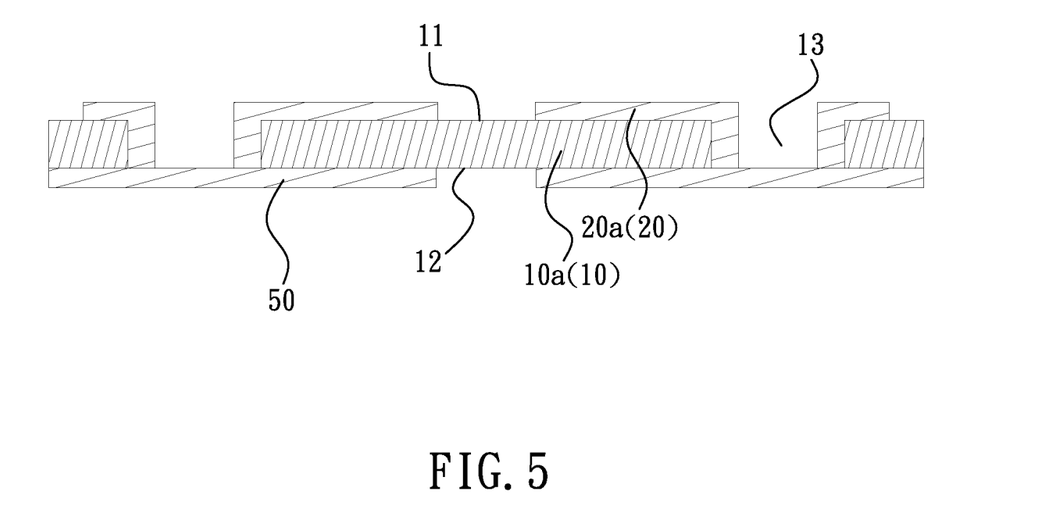
FIG. 5 is a side view of a section of a first substrate of an embodiment according to the present invention.

Step S1: providing a first substrate 10a which is provided with a first surface 11, a second surface 12 opposite to the first surface 11, and at least one first blind hole 13 mounted on the first surface 11 of the first substrate as shown in FIG. 5. A first circuit layer 20a is disposed on the first surface 11 of the first substrate 10a and an inner wall surface of the respective first blind holes 13, as shown in FIG. 5. The second surface 12 of the first substrate 10a is provided with a lower circuit layer 50 which is electrically connected with the first circuit layer 20a, as shown in FIG. 5.

Figure 6:
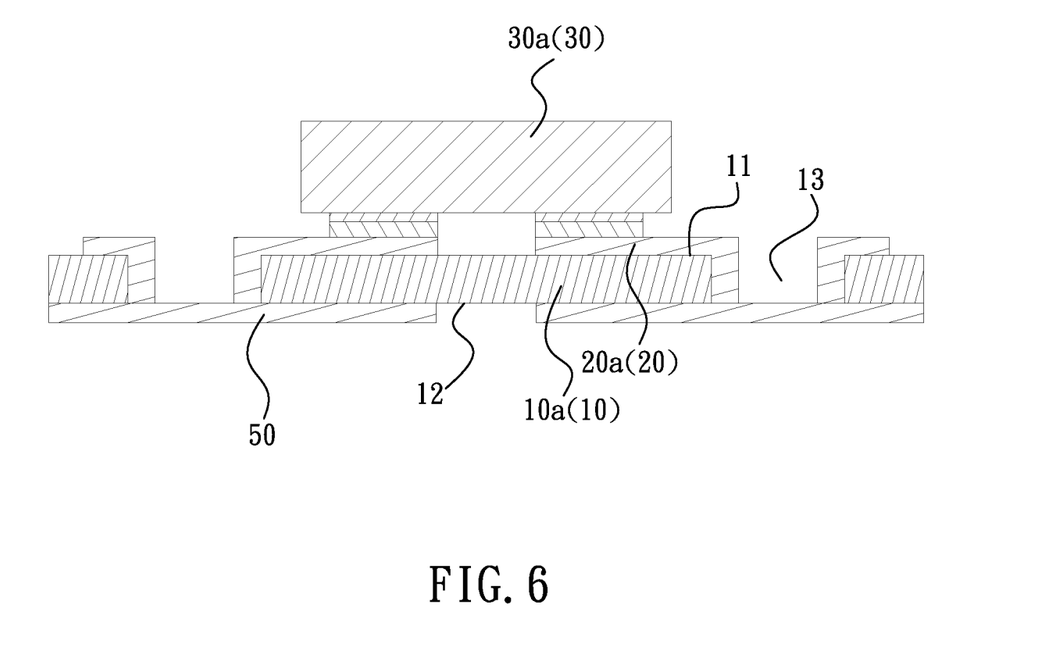
FIG. 6 is a schematic drawing showing a first chip disposed on the embodiment in FIG. 5 according to the present invention.

Step S2: disposing a first chip 30a on the first circuit layer 20a and the first chip 30a is electrically connected with the first circuit layer 20a, as shown in FIG. 6.

Figure 7:
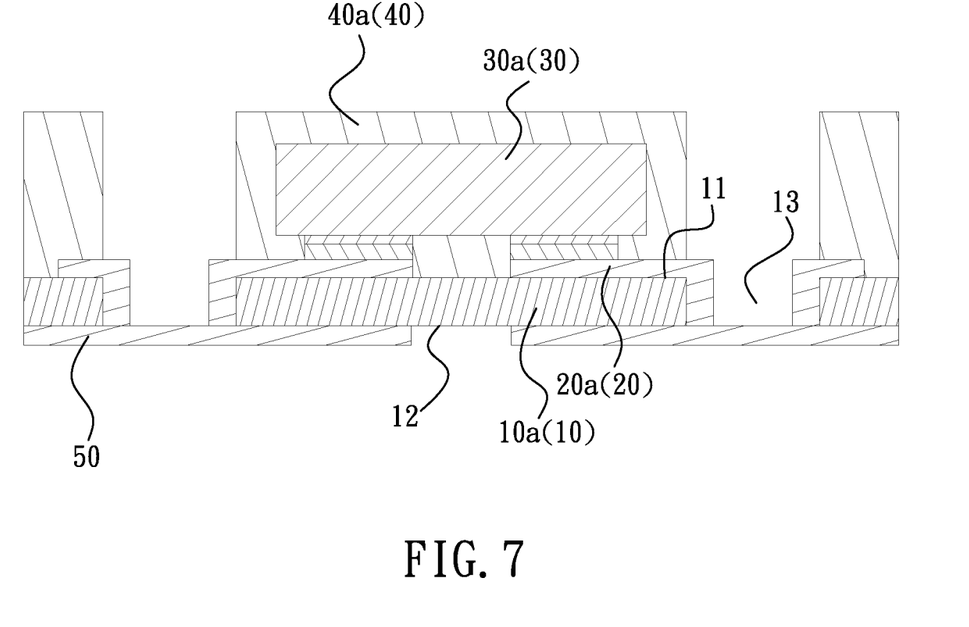
FIG. 7 is a schematic drawing showing a first insulation layer arranged at the embodiment in FIG. 6 according to the present invention.

Step S3: covering the first surface 11 of the first substrate 10a with a first insulation layer 40a by injection, as shown in FIG. 7.

Step S4: arranging a second substrate 10b over the first insulation layer while the second substrate 10b having a first surface 11 and a second surface 12 opposite to each other.

Figure 8:
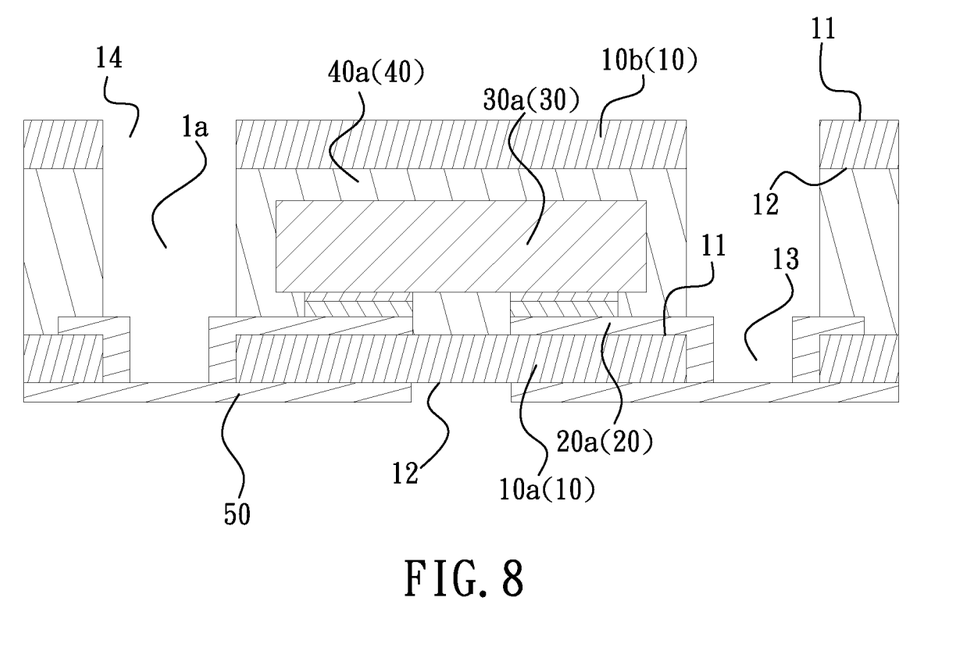
FIG. 8 is a schematic drawing showing a second substrate mounted to the embodiment in FIG. 7 according to the present invention.

Step S5: mounting at least one second blind hole 14 on the first surface 11 of the second substrate 10b and forming at least one first insertion hole 1a between the second blind hole 14 of the second substrate 10b and the first blind hole 13 of the first substrate 10a, as shown in FIG. 8.

Figure 9:
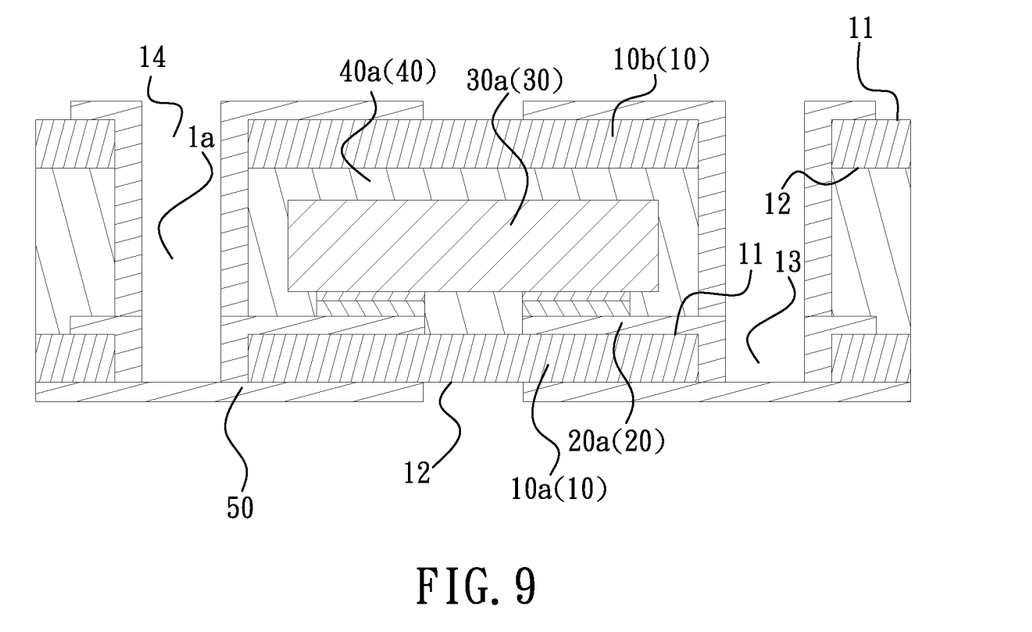
FIG. 9 is a schematic drawing showing a second circuit layer disposed on the embodiment in FIG. 8 according to the present invention.

Step S6: disposing a second circuit layer 20b on the first surface 11 of the second substrate 10b and extending the second circuit layer 20b along an inner wall surface of the respective second blind holes 14 while the second circuit layer 20b is electrically connected with the first circuit layer by the first insertion hole 1a, as shown in FIG. 9.

Figure 10:
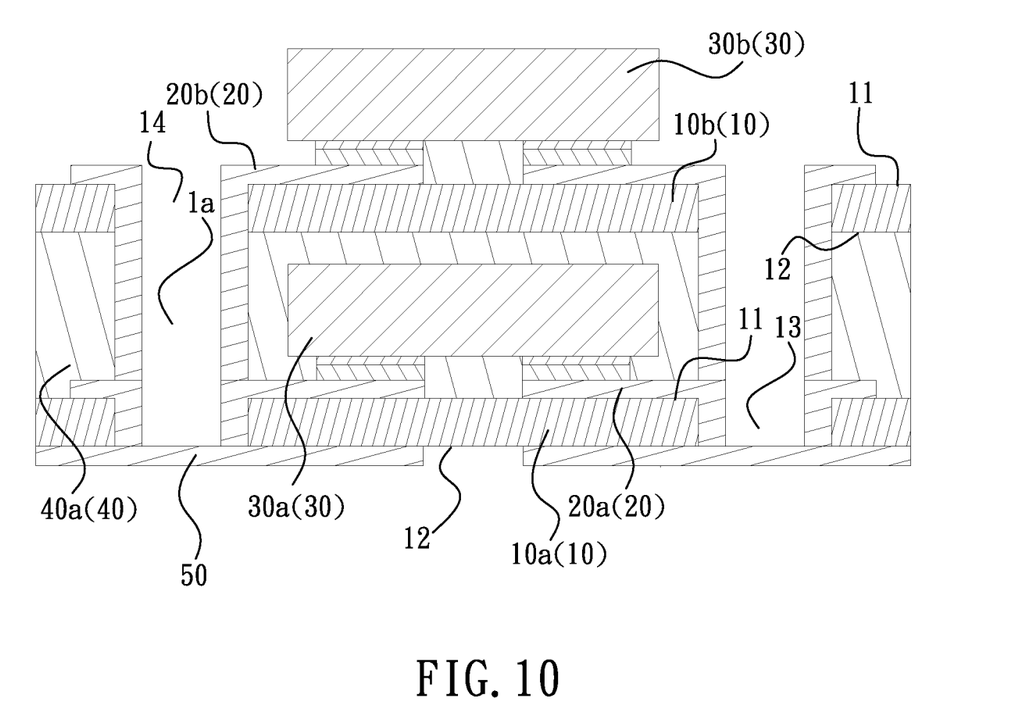
FIG. 10 is a schematic drawing showing a second chip arranged at the embodiment in FIG. 9 according to the present invention.

Step S7: arranging a second chip 30b at the second circuit layer 20b and the second chip 30b electrically connected with the second circuit layer as shown in FIG. 10.

Figure 11:
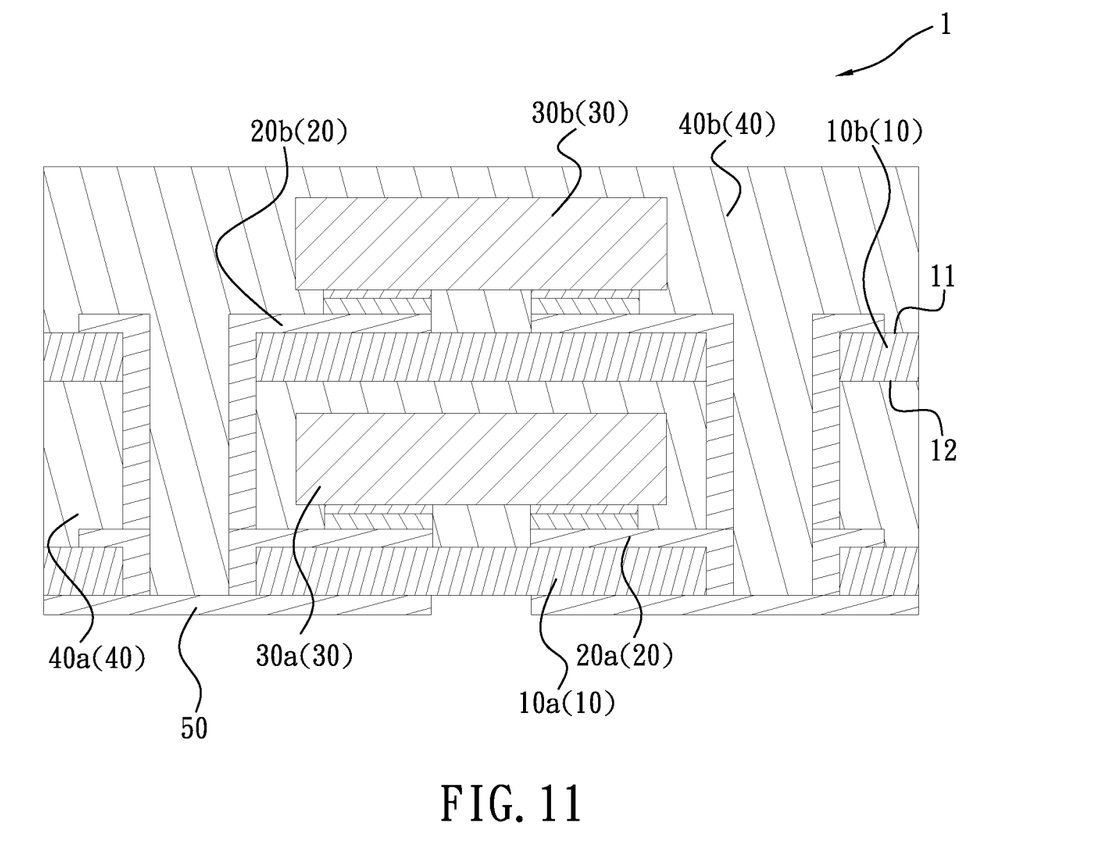
FIG. 11 is a schematic drawing showing a first insulation layer arranged at the embodiment in FIG. 10 according to the present invention.

Step S8: covering the first surface 11 of the second substrate 10b with a second insulation layer 40b which is coating and filling gaps left in the multi-layer stacked chip package 1 by the second chip 30b. as shown in FIG. 11.

Refer to FIG. 3, an embodiment of the multi-layer stacked chip package 1 is formed by three layers of chip package stacked over one another, The respective substrates 10 further include a third substrate 10c which is located over the second substrate 10b and having a first surface 11 and a second surface 12 opposite to the first surface 11. The second substrate 10b and the third substrate 10c are respectively arranged at a lower position and an upper position and corresponding to each other. At least one third blind hole 15 is mounted to the first surface 11 of the third substrate 10c and at least one second insertion hole 1c is provided between the respective third blind holes 15 of the third substrate 10c and the second substrate 10b, or between the respective third blind holes 15 of the third substrate 10c and the respective second blind holes 14 of the second substrate 10b. Refer to FIG. 3, the multi-layer stacked chip package 1 includes the two second insertion holes 1c. The respective circuit layers 20 further include a third circuit layer 20c located over the second circuit layer 20b, arranged at the first surface 11 of the third substrate 10c, and extending along an inner wall surface of the respective third blind hole 15. The third circuit layer 20c and the second circuit layer 20b are respectively disposed on an upper position and a lower position and corresponding to each other. The respective chips further includes a third chip 30c located over the second chip 30b so that the third chip 30c and the second chip 30b are respectively disposed on an upper position and a lower position and corresponding to each other. The third chip 30c is electrically connected with and arranged over the third circuit layer 20c. The insulation layers 40 further includes a third insulation layer 40c which is mounted over the second insulation layer 40b and disposed on the first surface 11 of the third substrate 10c by injection. The third insulation layer 40c and the second insulation layer 40b are respectively mounted to an upper position and a lower position and corresponding to each other.

The third substrate 10c, the third circuit layer 20c, the third chip 30c, and the third insulation layer 40c form a third layer chip package 1f. As shown in FIG. 3, the third layer chip package if and the second layer chip package 1e with respect to each other are respectively an upper layer chip package and a lower layer chip package. Optionally, the third chip 30c can be electrically connected with the second chip 30b by the third circuit layer extending to the second chip 30b through the respective second insertion holes 1c, electrically connected with the first chip 30a by the third circuit layer 20c extending to the first chip 30a through the respective second insertion holes 1c and the respective first insertion holes 1a, or electrically connected with the lower circuit layer 50 by the third circuit layer 20c extending to the lower circuit layer 50 through the respective second insertion holes 1c and the respective first insertion holes 1a.

Figure 4:
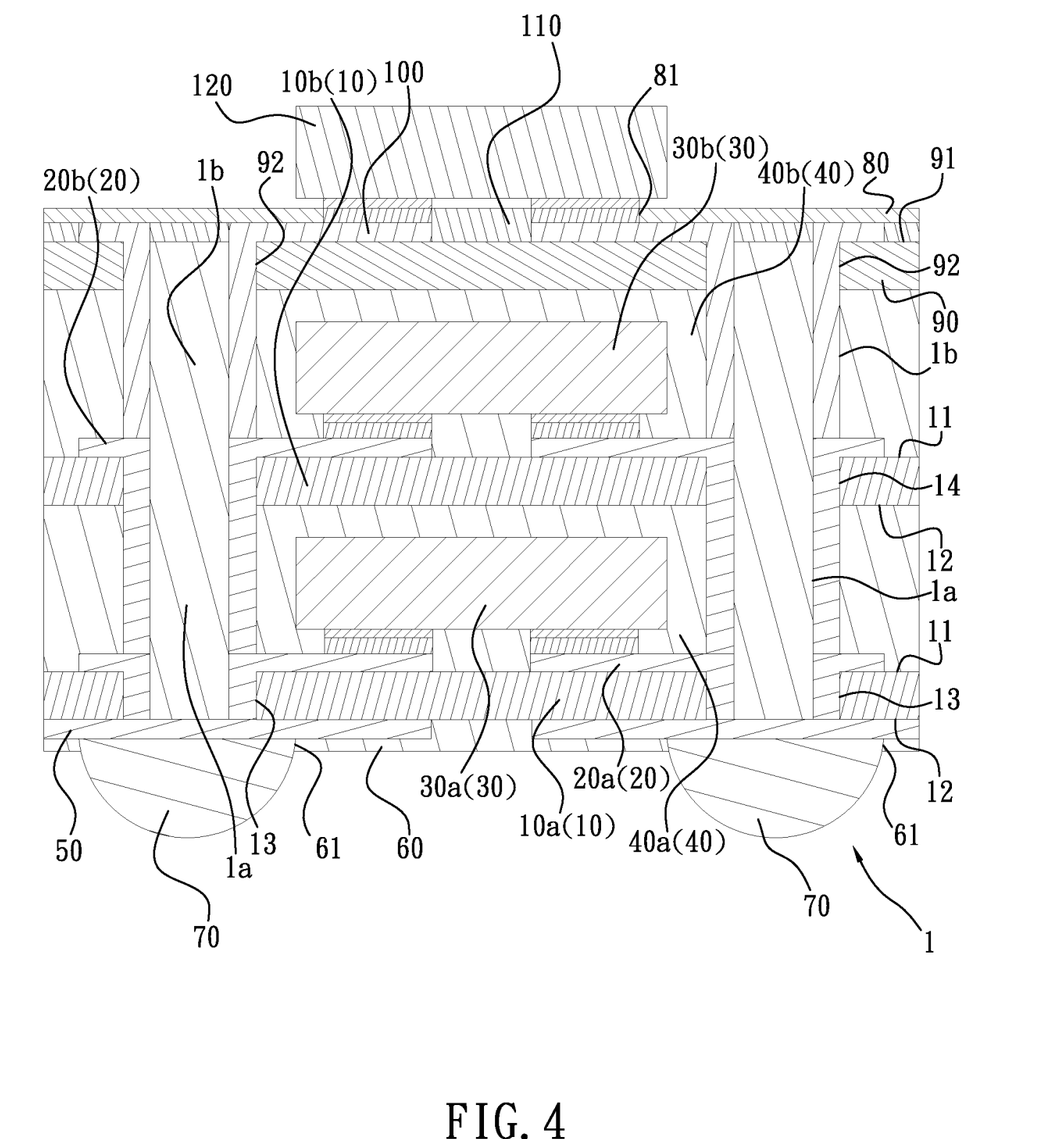
FIG. 4 is a side view of a section of an embodiment of a multi-layer stacked chip package having an external chip outside according to the present invention.

Refer to FIG. 4, in this embodiment, a multi-layer stacked chip package 1 according to the present invention includes two layers of package structure stacked with a chip located outside the multi-layer stacked chip package 1. The multi-layer stacked chip package 1 is further provided with an upper substrate 90, an upper circuit layer 100, an external chip 120, and an upper insulation layer 110. The upper substrate 90 is disposed on the second insulation layer 40b and provided with a first surface 91 while at least one upper blind hole 92 formed on the first surface 91 of the upper substrate 90. At least one upper insertion hole 1b is mounted between the upper blind hole 92 of the upper substrate 90 and the second substrate 10b. Or the respective upper insertion holes 1b are arranged between the respective upper blind holes 92 of the upper substrate 90 and the respective second blind holes 14 of the second substrate 10b. Refer to FIG. 4, the multi-layer stacked chip package 1 includes the two upper insertion holes 1b, but not limited. The upper circuit layer 100 is disposed on the first surface 91 of the upper substrate 90 and extending to an inner wall surface of the respective upper blind holes 92. The external chip 120 is arranged at the upper circuit layer 100 and electrically connected with the upper circuit layer 100 through at least one upper opening 81 of the upper outer protective layer 80. As shown in FIG. 4, the upper outer protective layer 80 includes the two upper openings 81, but not limited. The upper insulation layer 110 is covering the first surface 91 of the upper substrate 90 by injection technique. Optionally, the external chip 120 can be electrically connected with the second chip 30b by the upper circuit layer 100 extending to the second chip 30b through the respective upper insertion holes 1b, electrically connected with the first chip 30a by the upper circuit layer 100 extending to the first chip 30a through the respective upper insertion holes 1b and the respective first insertion holes 1a, or electrically connected with the lower circuit layer 50 by the upper circuit layer 100 extending to the lower circuit layer 50 through the respective upper insertion holes 1b and the respective first insertion holes 1a. Thereby the products have multiple functions or the computation efficiency of the chip is increased.

The invention claimed is:

1. A multi-layer stacked chip package comprising:
at least two substrates including a first substrate and a second substrate located over the first substrate so that the first substrate and the second substrate are respectively disposed on a lower position and an upper position and corresponding to each other; wherein the first substrate is provided with a first surface and a second surface opposite to each other while at least one first blind hole is mounted on the first surface of the first substrate; wherein the second substrate is provided with a first surface and a second surface opposite to each other while at least one second blind hole is arranged at the first surface of the second substrate; wherein at least one first insertion hole is disposed between the second blind hole of the second substrate and the first substrate; or the first insertion hole is formed between the second blind hole of the second substrate and the first blind hole of the first substrate;
at least two circuit layers having a first circuit layer and a second circuit layer located over the first circuit layer so that the first circuit layer and the second circuit layers are respectively disposed on a lower position and an upper position and corresponding to each other; wherein the first circuit layer is disposed on the first surface of the first substrate and extending along an inner wall surface of the first blind hole; wherein the second circuit layer is arranged at the first surface of the second substrate and extended along an inner wall surface of the second blind hole;
at least two chips including a first chip and a second chip located over the first chip so that the first chip and the second chip are respectively arranged at a lower position and an upper position and corresponding to each other; wherein the first chip and the second chip are respectively electrically connected with and disposed on the first circuit layer and the second circuit layer;
at least two insulation layers having a first insulation layer and a second insulation layer located over the first insulation layer so that the first insulation layer and the second insulation layer are respectively disposed on a lower position and an upper position and corresponding to each other; wherein the first insulation layer and the second insulation layer are respectively covering the first surface of the first substrate and the first surface of the second substrate by injection; and
a lower circuit layer which is disposed on the second surface of the first substrate for external electrical connection;
wherein the first substrate, the first circuit layer, the first chip, and the first insulation layer form a lower layer chip package while the second substrate, the second circuit layer, the second chip, and the second insulation layer form an upper layer chip package; wherein the upper layer chip package is stacked over the lower layer chip package so that the multi-layer stacked chip package is formed by such stacking mode;
wherein the first chip is electrically connected with the lower circuit layer by the first circuit layer; wherein the second chip is optionally electrically connected with the first chip by the second circuit layer extending to the first chip through the first insertion hole, or electrically connected with the lower circuit layer by the second circuit layer extending to the lower circuit layer through the first insertion hole.

2. The multi-layer stacked chip package as claimed in claim 1, wherein a vertical axis of the second blind hole and a vertical axis of the first insertion hole are the same as a vertical axis of the first blind hole so that the second blind hole, the first insertion hole, and the first blind hole form a communicating hole.

3. The multi-layer stacked chip package as claimed in claim 1, wherein a vertical axis of the second blind hole and a vertical axis of the first insertion hole are not the same as a vertical axis of the first blind hole so that the second blind hole, the first insertion hole, and the first blind hole are not communicating with one another.

4. The multi-layer stacked chip package as claimed in claim 1, wherein a lower outer protective layer is arranged under the lower circuit layer and provided with at least one lower opening on which a solder ball is disposed for external electrical connection.

5. The multi-layer stacked chip package as claimed in claim 1, wherein the multi-layer stacked chip package is further provided with an upper substrate, an upper circuit layer, an external chip, and an upper insulation layer; wherein the upper substrate is disposed on the second insulation layer and provided with a first surface while at least one upper blind hole formed on the first surface of the upper substrate; wherein at least one upper insertion hole is mounted between the upper blind hole of the upper substrate and the second substrate, or the upper insertion hole is arranged between the upper blind hole of the upper substrate and the second blind hole of the second substrate; wherein the upper circuit layer is disposed on the first surface of the upper substrate and extending to an inner wall surface of the upper blind bole; wherein the external chip is arranged at and electrically connected with the upper circuit layer; wherein the upper insulation layer is covering the first surface of the upper substrate by injection; wherein the external chip is optionally electrically connected with the second chip by the upper circuit layer extending to the second chip through the upper insertion hole, electrically connected with the first chip by the upper circuit layer extending to the first chip through the upper insertion hole and the first insertion hole, or electrically connected with the lower circuit layer by the upper circuit layer extending to the lower circuit layer through the upper insertion hole and the first insertion hole.

\* \* \* \* \*